(12) United States Patent
Su et al.

(10) Patent No.: US 12,288,756 B2
(45) Date of Patent: Apr. 29, 2025

(54) SEMICONDUCTOR PACKAGE WITH INTEGRATED CAPACITORS

(71) Applicant: CHIPLETZ, INC., Dover, DE (US)

(72) Inventors: Michael Su, Austin, TX (US); Michael Alfano, Austin, TX (US); Siddharth Ravichandran, Austin, TX (US)

(73) Assignee: Chipletz, Inc., Spicewood, TX (US)

( * ) Notice: Subject to any disclaimer, the term of this patent is extended or adjusted under 35 U.S.C. 154(b) by 414 days.

(21) Appl. No.: 17/692,587

(22) Filed: Mar. 11, 2022

(65) Prior Publication Data

US 2023/0290746 A1   Sep. 14, 2023

(51) Int. Cl.

| | |
|---|---|
| *H01L 23/52* | (2006.01) |
| *H01L 23/498* | (2006.01) |
| *H01L 23/64* | (2006.01) |
| *H01L 25/16* | (2023.01) |
| *H10D 1/00* | (2025.01) |
| *H10D 1/68* | (2025.01) |
| *H01L 23/00* | (2006.01) |

(52) U.S. Cl.
CPC ...... *H01L 23/642* (2013.01); *H01L 23/49816* (2013.01); *H01L 23/49822* (2013.01); *H01L 23/49838* (2013.01); *H01L 25/16* (2013.01); *H10D 1/042* (2025.01); *H10D 1/043* (2025.01); *H10D 1/716* (2025.01); *H01L 24/16* (2013.01); *H01L 2224/16235* (2013.01)

(58) Field of Classification Search
None
See application file for complete search history.

(56) References Cited

U.S. PATENT DOCUMENTS

| | | | |
|---|---|---|---|
| 7,190,592 B2 * | 3/2007 | Hu | H01L 23/642 |
| | | | 257/E23.079 |
| 7,564,116 B2 * | 7/2009 | Ahn | H05K 1/162 |
| | | | 257/535 |
| 2002/0118523 A1 * | 8/2002 | Okabe | H01L 23/49822 |
| | | | 361/793 |
| 2007/0018287 A1 | 1/2007 | Coenen | |
| 2017/0250154 A1 | 8/2017 | Chi et al. | |
| 2018/0366429 A1 | 12/2018 | Chiu et al. | |

OTHER PUBLICATIONS

PCT/US2023/014794, Semiconductor Package With Integrated Capacitors, Mar. 8, 2023.

* cited by examiner

*Primary Examiner* — Nicholas J Tobergte
(74) *Attorney, Agent, or Firm* — Artie Pennington Law Offices, PLLC; Artie Pennington; Jeffrey Van Myers

(57) ABSTRACT

In one aspect, a capacitor or network of capacitors is/are provided for vertical power delivery in a package where the capacitor(s) is/are embedded in or forms the entirety of the package substrate core. In a second aspect, a plurality of thin-film capacitor structures are provided for implementing vertical power delivery in a package. In a third aspect a method is provided for fabricating hermetically sealed thin-film capacitors.

10 Claims, 13 Drawing Sheets

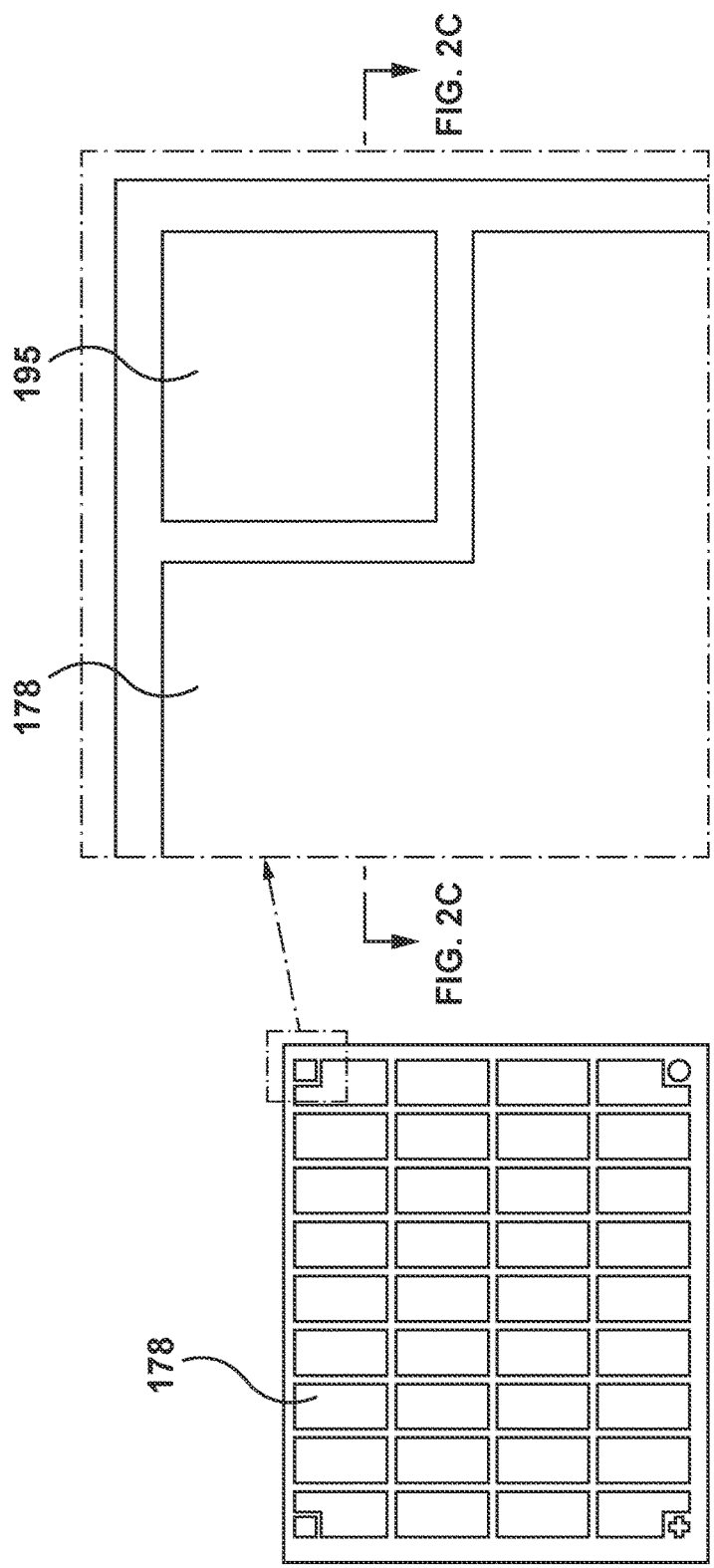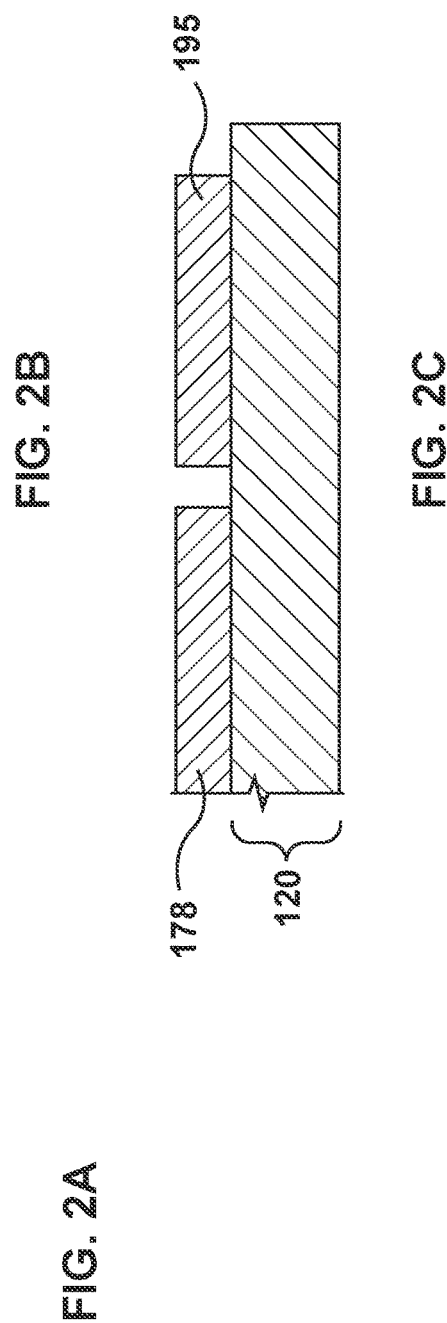

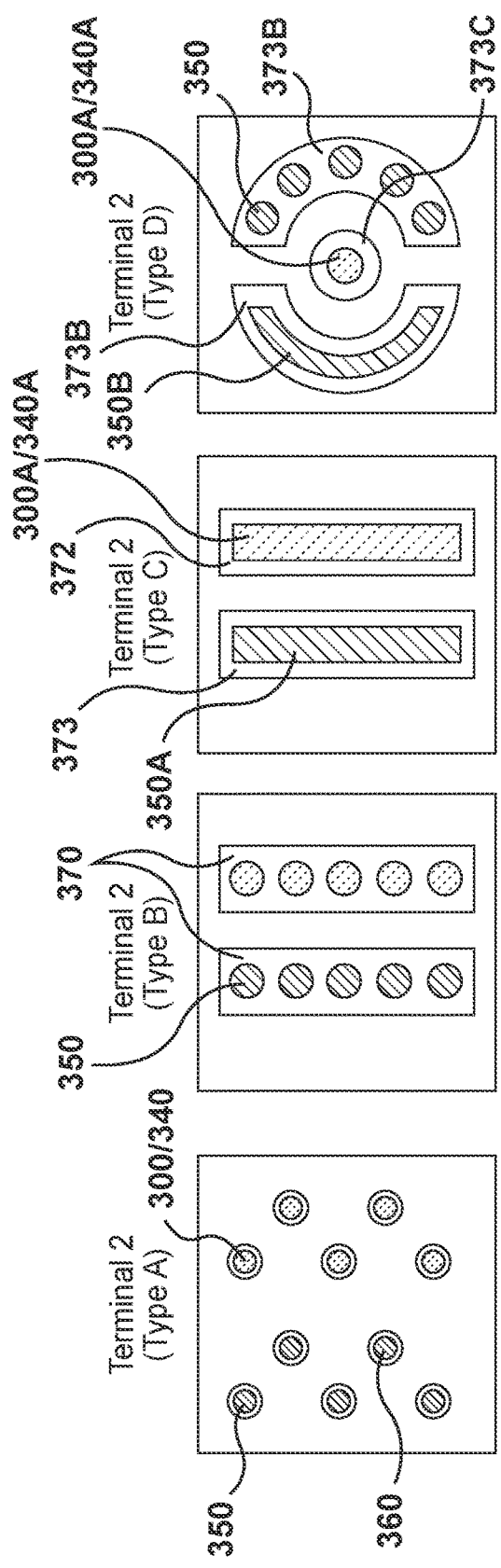
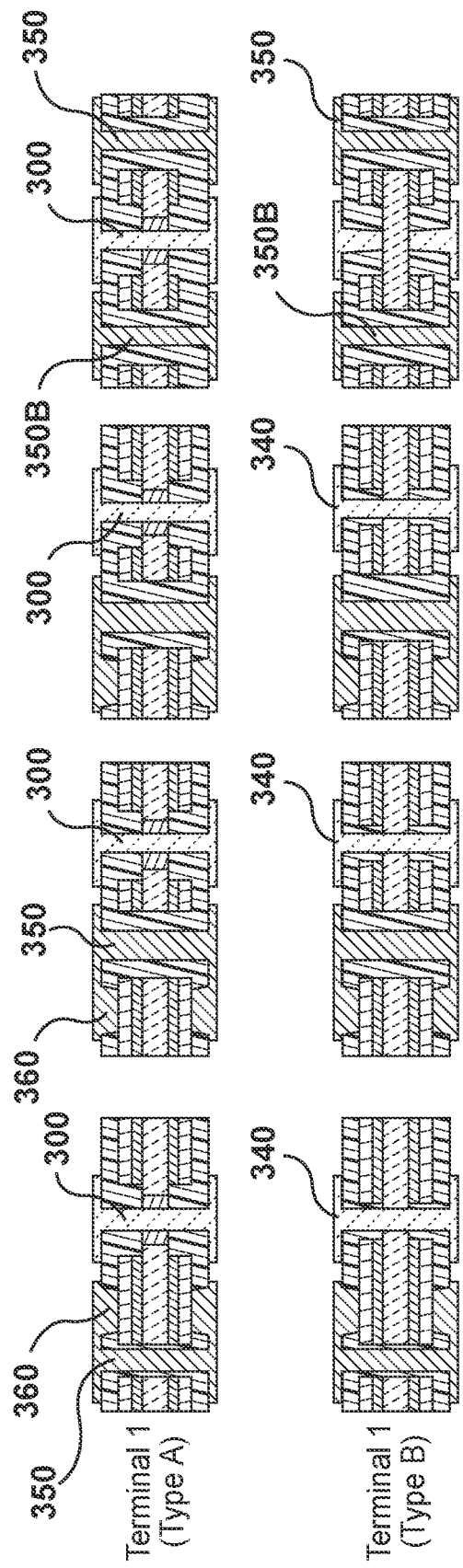
FIG. 3A  FIG. 3B  FIG. 3C  FIG. 3D

SEMICONDUCTOR PACKAGE WITH INTEGRATED CAPACITORS

BACKGROUND OF THE INVENTION

1. Field of the Invention

The present invention is directed to semiconductor packages and in particular to flip chip packages with integrated capacitors, and to thin-film capacitor structures, and to sealing of thin-film capacitors.

2. Description of the Related Art

Semiconductor packages, such as flip chip packages, are known in the art for interconnecting surface attachable devices (e.g., semiconductor devices, 1C chips, integrated passive devices, microelectromechanical systems (MEMS) or other electrical, optical, mechanical, thermal, magnetic, quantum etc. devices), to external circuitry (e.g. printed circuit board (PCB)) via interconnects. First-level interconnects are located between the surface attachable devices and the package and second-level interconnects are located between the package and the board. Interconnects may also be located between the package and capacitors for power delivery, noise filtering, etc.

In order to mount a conventional flip chip to external circuitry, such as a circuit board, the chip is singulated or cut into individual chips which are then flipped over so that the top side faces down. The chip pads are aligned with matching pads on the external circuitry, and the solder bumps are then reflowed to make a connection between the singulated chip and the external circuitry.

A package may include a redistribution layer (RDL) forming an interface between the surface attachable device and the package. An RDL is an extra metal layer consisting of wiring on top of core metals that can be used, for example to make I/O pads of a semiconductor die available for bonding out to other locations such as bump pads. Bumps are usually placed in a grid pattern and each one is molded with two pads (one on the top and one on the bottom) that are then attached to the RDL and package substrate, respectively. The RDL, therefore, serves as a layer connecting I/O pads and bump pads.

In flip chip design a 2D architecture is defined as an architecture where two or more active silicon devices are placed side-by-side on a package and are interconnected on the package. For example, a 2.5D package includes multiple dies inside the same package, where communication between chips is accomplished using either a silicon or organic interposer, while a 2.1D package includes multiple dies inside the same package with a few high-density wiring layers to interconnect the chips and coarser wiring layers to fanout to the external circuitry. A typical 2.1D package can replace a 2.5D interposer and a traditional organic substrate package.

It is known to use decoupling capacitors in flip chips for suppressing power supply noise in DC signals transmitted to the semiconductor die from the external circuitry. Such decoupling capacitors typical include terminals on left and right sides for lateral power delivery while filtering AC noise from being transmitted to the die, which requires either lateral signal routing through the capacitor or placement of the capacitor on the surface of the package, both of which contribute to RC signal delays and negatively impact device density.

SUMMARY OF THE INVENTION

It is an aspect of the present invention to provide a capacitor for vertical power delivery in a package where the capacitor is embedded in or forms the entirety of the package substrate core.

In another aspect, a plurality of thin-film capacitor structures are provided for vertical power delivery in a package.

In a further aspect, a method is provided for fabricating sealed thin-film capacitors.

According to an embodiment, there is provided in a package having at least one surface attachable device, a substrate core to which the semiconductor die is mounted on one side via first level interconnects, and second level interconnects on an opposite side of the substrate core for connection to external circuitry, by the improvement comprising at least one capacitor forming at least a portion of the substrate core; at least one redistribution layer adjacent the capacitor and at least one of the first level interconnects and second level interconnects, said at least one redistribution layer having wiring to one of either interconnect multiple surface attachable devices or fanout external connections from the multiple surface attachable devices, or deliver power from the external circuitry to the multiple surface attachable devices, wherein said at least one redistribution layer includes at least one vertical connection on at least one side of the capacitor for connecting the capacitor to the external circuitry and at least one surface attachable device for filtering AC noise; and at least one further vertical connection through the at least one capacitor.

According to another embodiment, there is provided a method of fabricating a plurality of sealed thin-film capacitors, comprising coating both sides of a thin film sheet with a seal to prevent moisture/gas/chemicals from penetrating functional layers of the capacitors wherein the thin film sheet comprises an insulator, a conductive core within the insulator, and a current collector separated from the conductive core by a dielectric; fabricating at least one first terminal forming one of either a cathode or anode connected to the conductive core through the insulator, and at least one second terminal forming the other of either the cathode or anode connected to the current collector; singulating the thin film sheet into a plurality of individual thin-film capacitors sealed on said both sides while unsealed on adjacent sides; and coating the unsealed adjacent sides with an additional seal.

According to another embodiment, there is provided a method of fabricating a package having at least one semiconductor die, a substrate core to which the semiconductor die is mounted on one side via first level interconnects, and second level interconnects on an opposite side of the substrate core for connection to external circuitry, the method comprising fabricating a thin-film capacitor having an insulator, a conductive core within the insulator, at least one first terminal forming one of either a cathode or anode connected to the conductive core through the insulator, a current collector separated from the conductive core by a dielectric, and at least one second terminal forming the other of either the cathode or anode connected to the current collector; singulating the thin film sheet into a plurality of individual thin-film capacitors; coating all sides of the singulated thin-film capacitor with a seal; and embedding the thin-film capacitor in the substrate core.

According to another embodiment, there is provided a method of fabricating a package having at least one semiconductor die, a substrate core to which the semiconductor die is mounted on one side via first level interconnects, and second level interconnects on an opposite side of the substrate core for connection to external circuitry, the method comprising fabricating a thin-film stack comprising a conductive core and a current collector separated from the conductive core by a dielectric coating top and bottom of the thin-film stack with a seal; fabricating an insulator around the thin-film stack; and drilling one or more vertical connections in the thin-film stack including at least two vertical connections for fabricating at least one first terminal forming one of either a cathode or anode connected to the conductive core through the insulator, and at least one second terminal forming the other of either the cathode or anode connected to the current collector through the insulator.

According to another embodiment, there is provided a method of fabricating a package having at least one semiconductor die, a substrate core to which the semiconductor die is mounted on one side via first level interconnects, and second level interconnects on an opposite side of the substrate core for connection to external circuitry, the method comprising fabricating a thin-film stack comprising a conductive core and a current collector separated from the conductive core by a dielectric; drilling one or more vertical connections though the thin film stack; coating all sides of the thin-film stack with a seal; surrounding the sealed thin-film stack with an insulator; and fabricating at least one first terminal forming one of either a cathode or anode connected using one of said vertical connections to the conductive core through the insulator and seal and fabricating at least one second terminal forming the other of either the cathode or anode connected using a further one of said vertical connections to the current collector through the insulator and seal.

According to another embodiment, there is provided a method of fabricating a package having at least one semiconductor die, a substrate core to which the semiconductor die is mounted on one side via first level interconnects, and second level interconnects on an opposite side of the substrate core for connection to external circuitry, the method comprising fabricating a thin-film stack comprising an insulator, a conductive core within the insulator and a current collector separated from the conductive core by a dielectric; drilling one or more vertical connections though the thin-film stack; fabricating at least one first terminal forming one of either a cathode or anode connected using one of said vertical connections to the conductive core through the insulator and seal, and fabricating at least one second terminal forming the other of either the cathode or anode connected using a further one of said vertical connections to the current collector through the insulator and seal; and fabricating a seal ring surrounding the thin-film stack as a barrier to one or more of moisture, gas and chemicals entering the dielectric and current collector.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 2A, 2B and 2C show plan, exploded plan and cross section views of a sheet of thin film capacitors having terminal metal that can be used as an alignment fiducial for embedding the capacitors in the package substrate core, according to an aspect of the invention.

FIG. 3A shows two cross section views of two types of a first terminal and a plan view of a second terminal according to a first embodiment of thin-film capacitor.

FIG. 3B shows two cross section views of two types of a first terminal and a plan view of a second terminal according to second embodiment of thin-film capacitor.

FIG. 3C shows two cross section views of two types of a first terminal and a plan view of a third terminal according to third embodiment of thin-film capacitor.

FIG. 3D shows two cross section views of two types of a first terminal and a plan view of a fourth terminal according to fourth embodiment of thin-film capacitor.

DETAILED DESCRIPTION OF THE PREFERRED EMBODIMENTS

Figure 1A:
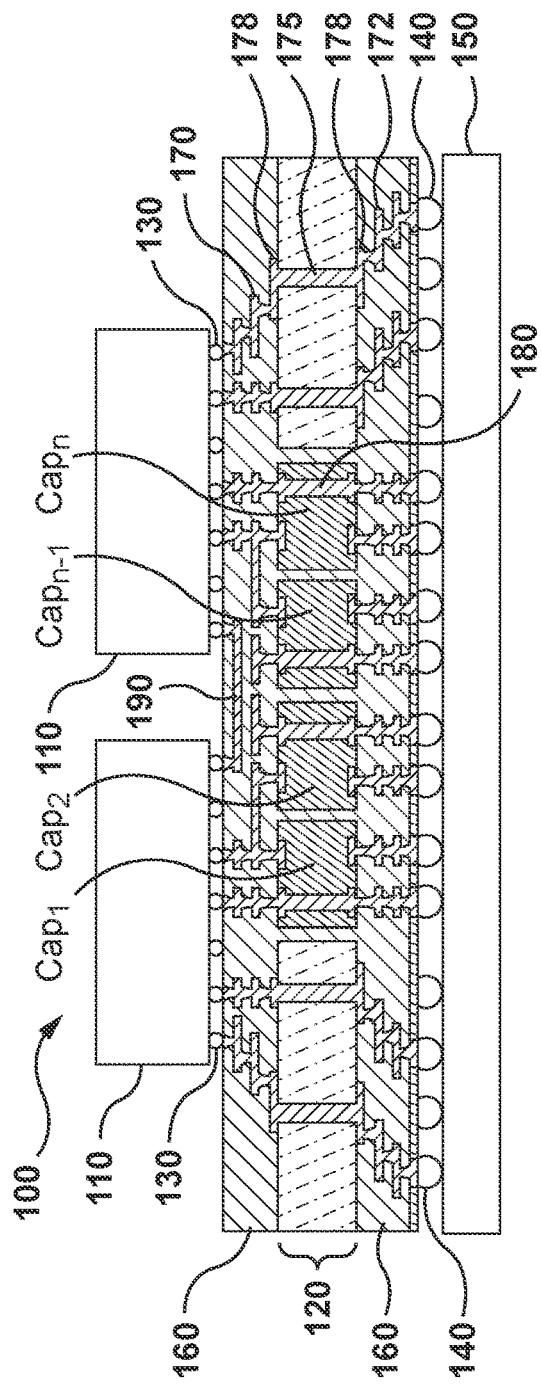
FIGS. 1A, 1B, 1C and 1D show cross section views of different embodiments of capacitors for vertical power delivery in a package where the capacitors are embedded in or form the entirety of the package substrate core, according to aspects of the invention.

As discussed above, this specification sets forth several general aspects, as follows: a first aspect whereby a capacitor or network of capacitors is/are provided for vertical power delivery in a package where the capacitor(s) is/are embedded in or forms the entirety of the package substrate core; a second aspect whereby a plurality of thin-film capacitor structures are provided for implementing vertical power delivery in a package; and a third aspect whereby a method is provided for fabricating sealed thin-film capacitors.

With respect to the first general aspect, FIGS. 1A, 1B, 1C and 1D show cross section views of different embodiments of capacitors for vertical power delivery in a package, such as a flip chip package 100 where the capacitors are embedded in or form the entirety of the package substrate core. As discussed below, the capacitors can be formed as a single component, or as multiple components and embedded in the flip chip substrate, or multiple components packaged/molded as one component before embedding in the flip chip substrate. Multiple capacitors can also be interconnected using capacitor terminal metal or the package redistribution layer (RDL) to form a capacitor network, as discussed below.

The flip chip package 100 has at least one surface attachable device 110, a substrate core 120 (e.g. plastic and/or fiberglass) to which the surface attachable device 110 is mounted on one side via first level interconnects (FLI) 130, such as solder bumps, and second level interconnects (SLI) 140, such as a plurality of solder balls on an opposite side of the substrate core 120 for connection to external circuitry 150, such as a printed circuit board (PCB). A person of skill in the art will understand that the FLI and SLI is not restricted to solder balls/bumps and can include LGA, BGA, etc.) In some applications, as discussed above, the semiconductor dies 110 can be replaced by other semiconductor devices, integrated passive devices, microelectromechanical systems (MEMS) or other components for connection to the external circuitry 150.

At least one capacitor ($Cap_1$, $Cap_2$ ... $Cap_{n-1}$, $Cap_n$ in FIGS. 1A, 1C and 1D, and Cap in FIG. 1B), forms at least a portion of the substrate core 120. At least one redistribution layer, RDL 160, is disposed adjacent the capacitor and at least one of the FLI 130 and SLI 140. Wiring 170/172 is provided within the RDL 160 for signal routing between the external circuitry 150, the at least one die 110 and the capacitor(s) through vertical connections, such as vias 175 having top and bottom terminal metals 178 on top and bottom sides of the capacitor(s). At least one further via 180 is provided for vertically passing DC power from the external circuitry 150 to the surface attachable device 110 through the capacitor(s). In embodiments, one or more of the vertical connections 175 and 180 can be plated-through holes (PTHs). Fine-pitch wiring 190 can also be provided in RDL 160 for signaling between semiconductor dies 110.

Figure 1B:
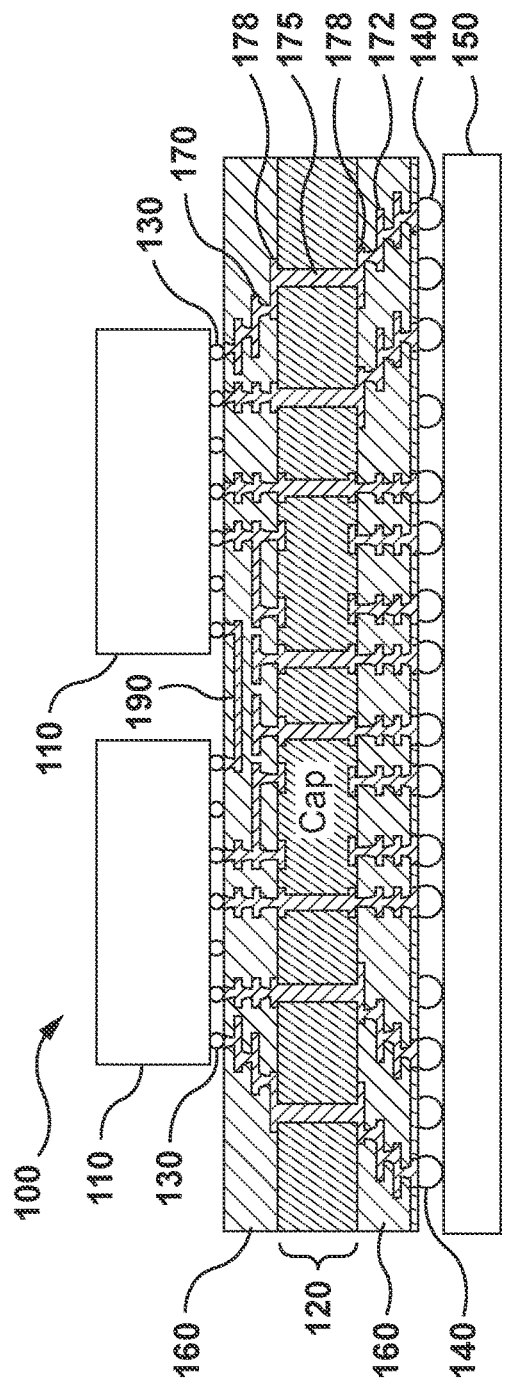
Figure 1C:
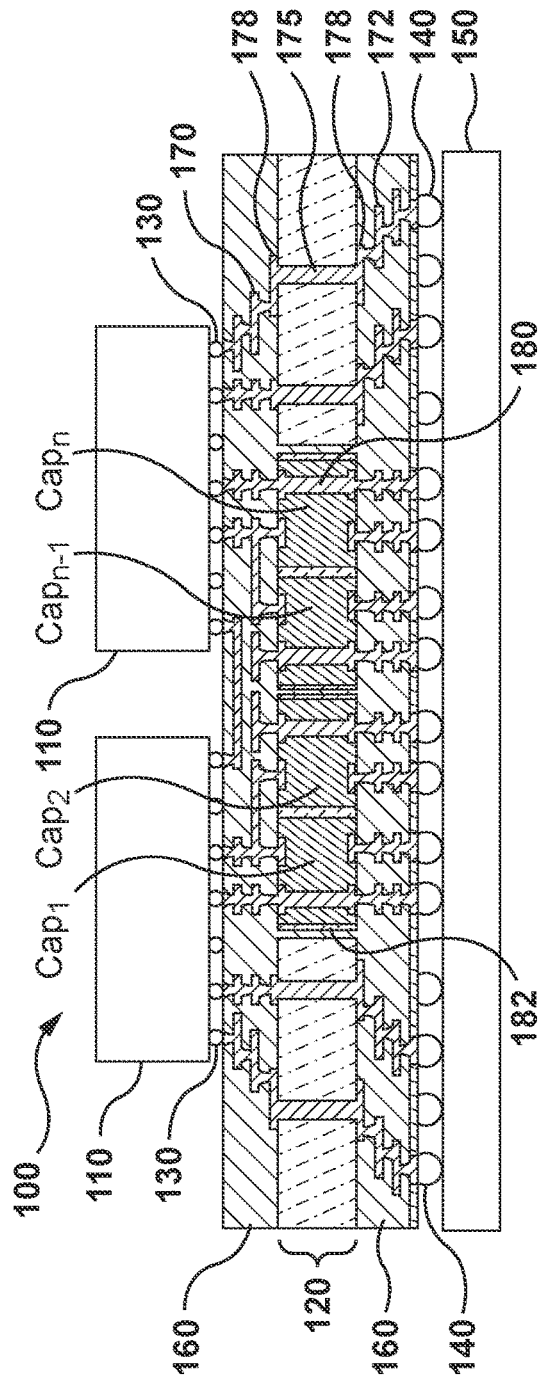
Figure 1D:
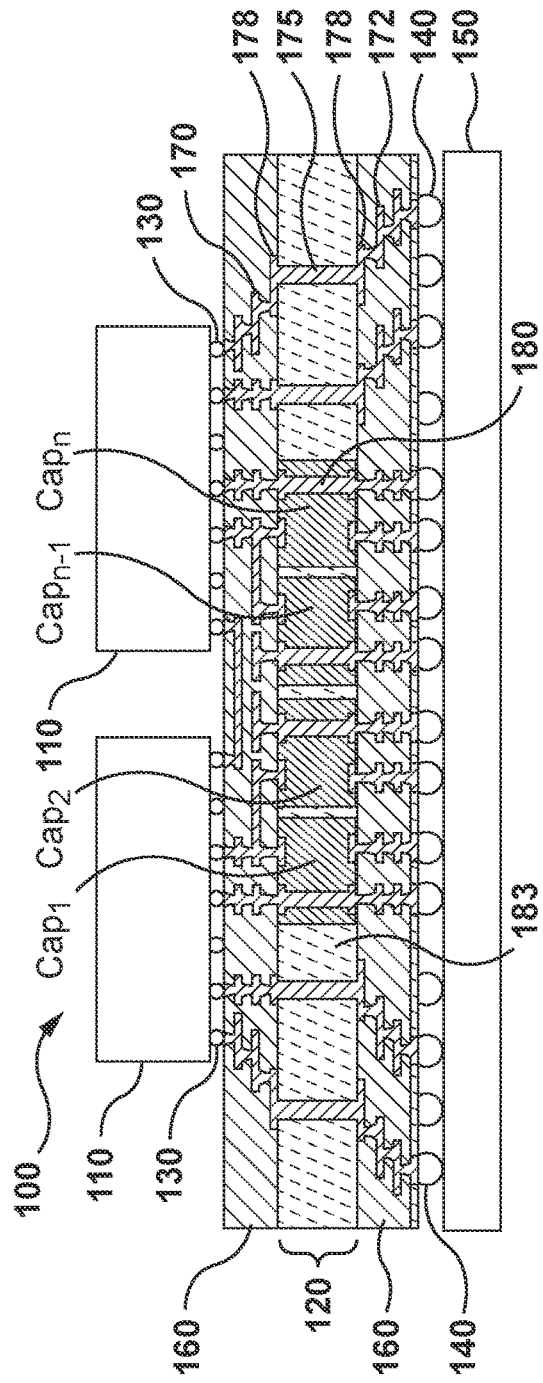

In FIG. 1A, the capacitors, $Cap_1$, $Cap_2$, ..., $Cap_{n-1}$, $Cap_n$, are embedded in cavities within the substrate core 120, while in FIG. 1B a single capacitor, Cap, forms the entirety of the core 120. In FIG. 1C, the capacitors, $Cap_1$, $Cap_2$, ..., $Cap_{n-1}$, $Cap_n$, are integrated within a capacitor module 182 which is then embedded in the cavities within the substrate core 120, while in FIG. 1D, multiple capacitors, $Cap_1$, $Cap_2$, ..., $Cap_{n-1}$, $Cap_n$, form a portion 183 of the core 120.

Figure 1E:
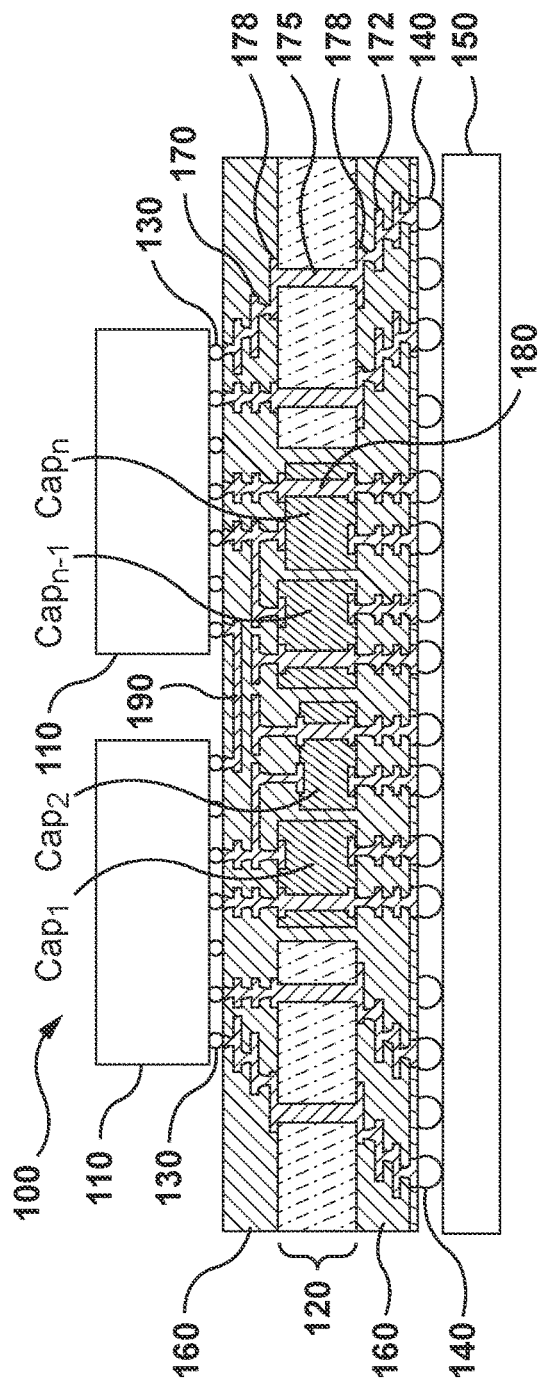
FIGS. 1E, 1F, and 1G are cross section views similar to FIGS. 1A, 1C and 1D where the capacitors are of different sizes, shapes, and thicknesses according to aspects of the invention.
Figure 1F:
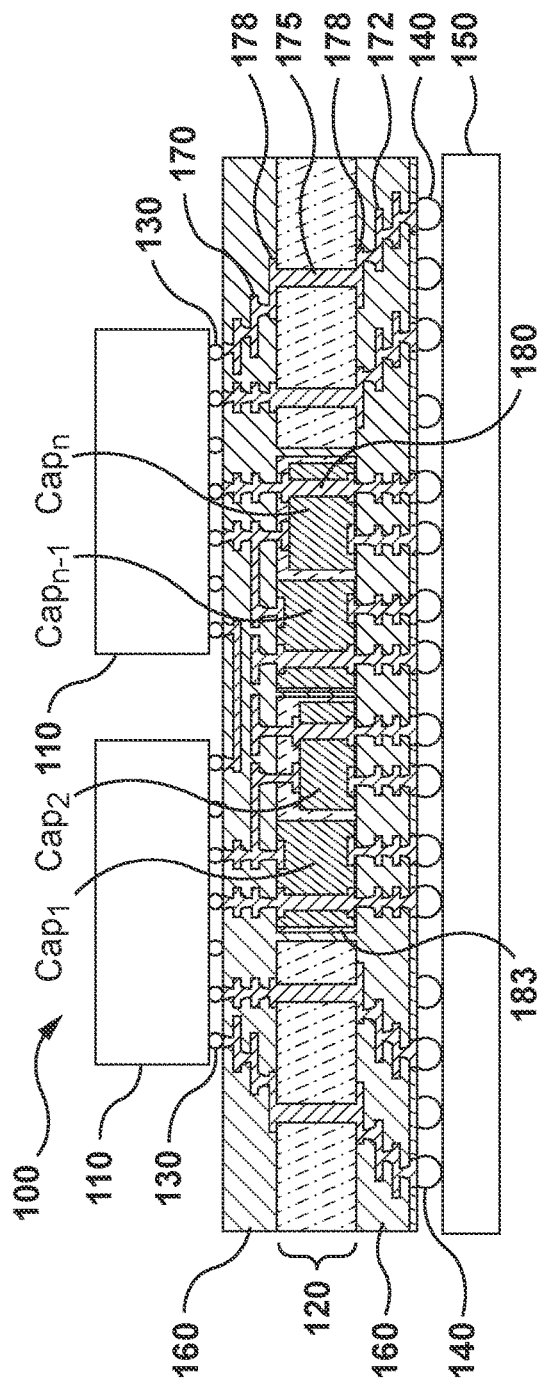
Figure 1G:
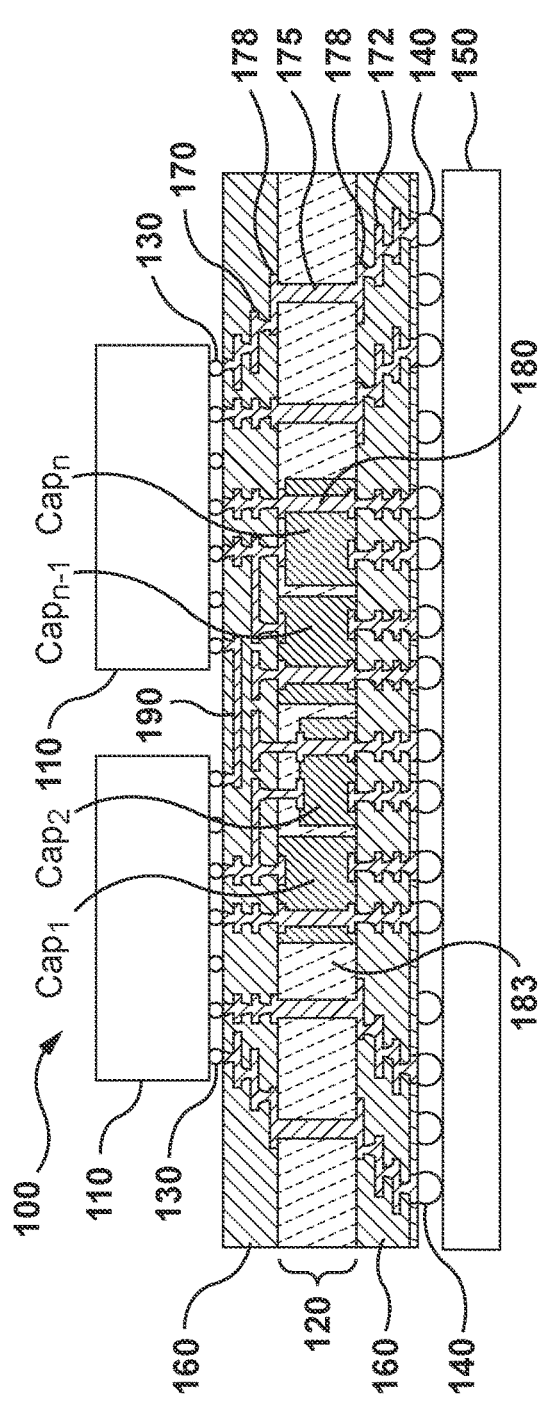

The capacitors, $Cap_1$, $Cap_2$ ... $Cap_{n-1}$, $Cap_n$, can be any (regular or irregular) shape, size, or thickness that follows the outline of dies 110, as shown in FIGS. 1E, 1F and 1G, and are designed to support power delivery to the dies 110. The capacitor(s) can be MLCC (multi-layer ceramic cap), thin-film based (Al, Ta, etc.), polymer-cap, etc., and can be a combination of different types of capacitors for different voltages (1.2 V, 5V, 100V depending on the capacitor), frequencies, and densities.

By forming at least a portion of the substrate core 120 with capacitor(s), at least some of the plurality of vertical connections within the RDL 160 can connect the capacitor(s) to the external circuitry 150 and at least one surface attachable device 110 for filtering AC noise from the DC power. Moreover, embedding or forming the substrate core 120 with the capacitor(s) and providing vertical delivery of DC power through the capacitor(s) avoids prior art problems of RC signal delays and poor device density resulting from the use of decoupling capacitors having terminals on left and right sides for lateral power delivery and signal routing through the capacitor or placement of the capacitor on the surface of the package.

As a result of the configurations of FIGS. 1A, 1B, 1C and 1D, terminal metals can be extremely close to each other (e.g. solder bumps on 130 on the bottom of the dies 110 having as small as 80 micron pitch can be made to line up with 80 micron pitch solder balls 140 without routing of DC through the RDL 160). Also, the resulting area dependent cathode and anode result in improved ESR/ESL and current carrying capability due to the increased number of current-carrying vertical connections through and between capacitors.

Figure 1H:
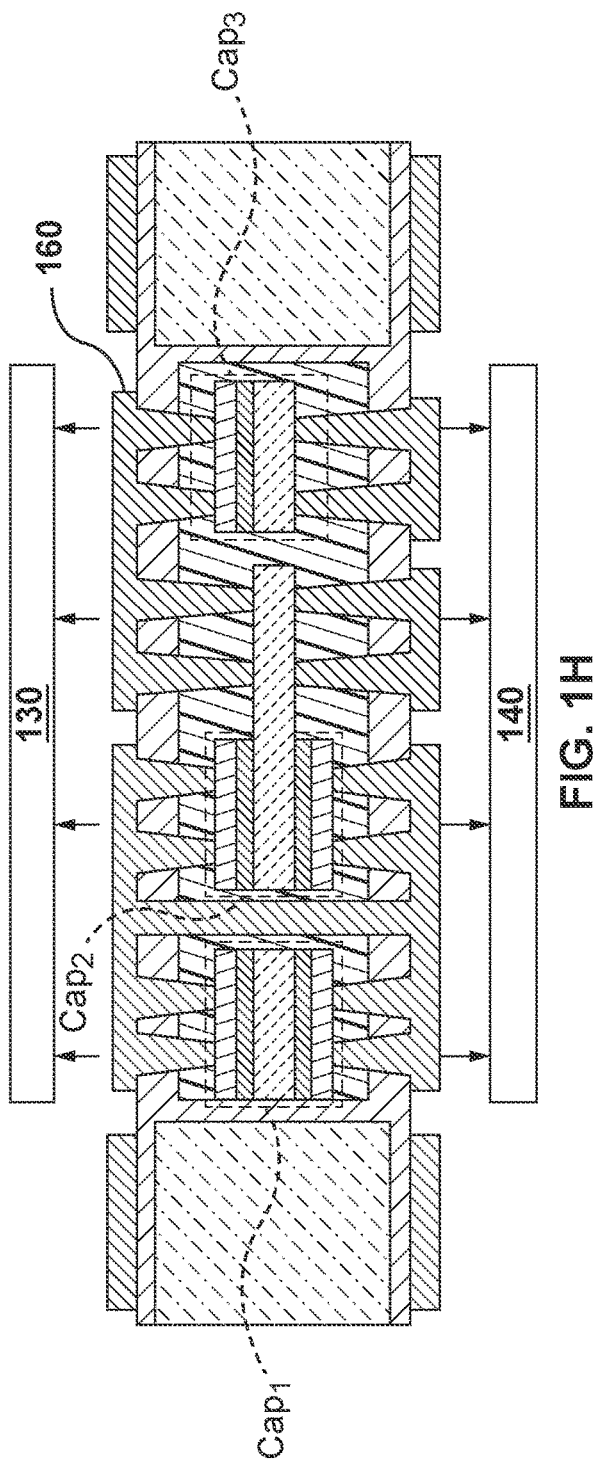
FIG. 1H shows a cross section of view of a network of capacitors formed by terminal metals or redistribution layers of the semiconductor package, according to aspects of the invention.
Figure 2D:
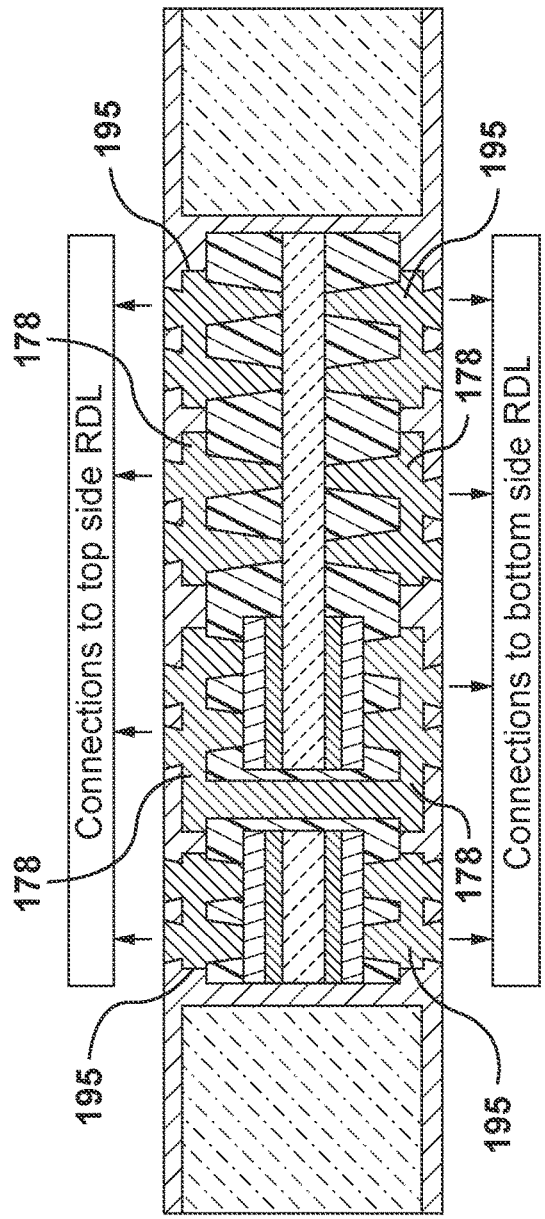
FIG. 2D is a cross section view showing terminal metals that can be used as an alignment fiducials for embedding a network of capacitors in the package substrate core, according to an aspect of the invention.

The package 100 can be a 2.1D flip chip package wherein the RDL 160 between the substrate core 120 and FLI 130 includes fine pitch wiring 170 between the substrate core 120 and semiconductor dies 110 for at least one of interconnecting the plurality of semiconductor dies 110 and forming a network of capacitors $Cap_1$, $Cap_2$, ..., $Cap_{n-1}$, $Cap_n$, in the substrate core 120, as shown in FIG. 1H, and wherein the RDL 160 between the substrate core 120 and SLI 140 includes coarser density wiring 172 for fanning out signals to the external circuitry 150.

In FIG. 1H, RDL 160 (or terminal metal 178) is used to create a network of capacitors ($Cap_1$, $Cap_2$, $Cap_3$), constructed as multiple components or as a single component connected at the terminal metal or RDL level.

To embed the capacitor in the substrate 120, the capacitor must be picked and placed which requires alignment fiducials. This uses up area in the capacitor resulting in lost capacitance. Therefore, according to the embodiment of FIGS. 2A, 2B, 2C and 2D a sheet of thin film capacitors is fabricated having terminal metal 178 that can be used as an alignment fiducial 195 for embedding the capacitors in the package substrate core 120 of the flip chip packages shown in FIGS. 1A, 1C and 1D, wherein the vertical connections 178 from the RDL 160 can be dropped on the terminal metal/alignment fiducial 195. The fiducial 195 can be of any shape, such as a square, rectangle, 'plus' sign, circle, etc.

Figure 3:
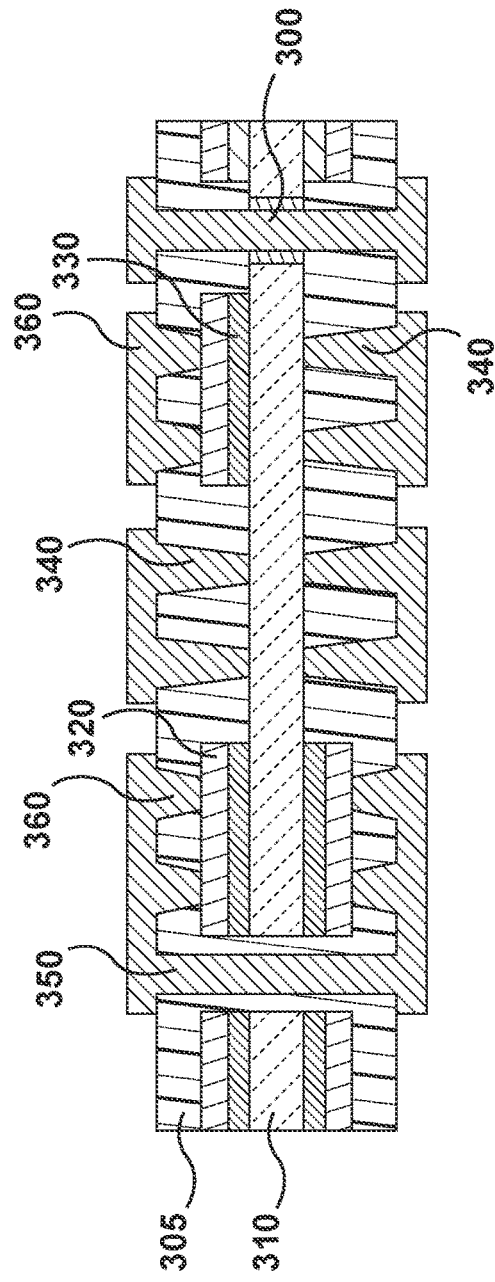
FIG. 3 shows a cross section view of different embodiments of thin-film capacitors, according to aspects of the invention.

With respect to the second general aspect, FIG. 3 shows a cross section view of different embodiments of thin-film capacitors having an insulator 305, a conductive core 310 within the insulator, at least one first terminal (Terminal 1) forming one of either a cathode or anode connected to the conductive core 310 through the insulator 305, a current collector 320 separated from the conductive core by a dielectric 330, and at least one second terminal (Terminal 2) connected to the current collector forming the other of the cathode or anode.

Terminal 1 can be connected to one of either a top or bottom surface of the conductive core 310 using at least one blind via 340, or to a side surface of the conductive core 310 using at least one plated-through hole with metallic contact to the core 310.

Terminal 2 can include at least one plated-through hole 350 for passing DC current through the conductive core 310 and via(s) 360 for connection to the current collector 320.

In aspects, the thin-film capacitor of FIG. 3 can be sealed with a metal ring of various patterns at the top and bottom of the capacitor periphery for use as a moisture/oxidation barrier, crack-stop, ion gathering, etc. The metal rings can also be used as terminal metal for DC power pass through, or an as alignment mark for pick and place, as discussed above with reference to FIGS. 2A, 2B and 2C.

FIG. 3A shows two cross section views of two types of Terminal 1 (Types A and B) and a plan view of Terminal 2 according to a first type of thin-film capacitor (Type A). In the embodiments of FIG. 3A, a plurality of ganged vias 340 and 360 (i.e. isolation holes) are used for connecting Terminal 1 and Terminal 2 to the conductive core 310 and current collector 320, respectively, and a plurality of plated-through holes 300 and 350 are used for vertical DC power delivery and for connecting Terminal 1 to the conductive core 310.

FIG. 3B shows two cross section views of two types of Terminal 1 (Types A and B) and a plan view of Terminal 2 according to a second type of thin-film capacitor (Type B). In the embodiments of FIG. 3B, the plated-through holes 350 for vertical DC power delivery and the plurality of vias 300/340 are respectively ganged together in slots 370 in the insulator 305. The embodiments of FIG. 3B allow for a more densely packed flip chip package than the embodiments of FIG. 3A, since the vias are not required to be individually drilled.

FIG. 3C shows two cross section views of two types of Terminal 1 (Types A and B) and a plan view of Terminal 2 according to a third type of thin-film capacitor (Type C). In the embodiments of FIG. 3C, the plated-through holes 350 and the plurality of vias 300/340 of FIG. 3B are replaced by rectangular trenches 373 and 372, respectively filled with a conductor 350A and conductor 300A/340A. The embodiments of FIG. 3C provide lower resistance and therefore higher current carrying capability than the embodiments of FIGS. 3A and 3B.

FIG. 3D shows two cross section views of two types of Terminal 1 (Types A and B) and a plan view of Terminal 2 according to a fourth type of thin-film capacitor (Type D). In the embodiments of FIG. 3D, the rectangular trench 373 of FIG. 3C is replaced by a pair of non-rectangular trenches 373B filled with a semi-circular conductor 350B and vias 350, respectively, and the vias 300/340 of FIGS. 3A and 3B are replaced by a single via 300A/340A within a trench 373C which acts as the capacitor anode. In FIG. 3D the non-rectangular trenches 373B are semi-circular, although other shapes may be used.

The following table summarizes the combinations of thin-film capacitor structures available withe configurations of FIGS. 3A-3D.

|  | FIG. 3A | FIG. 3B | FIG. 3C | FIG. 3D |
| --- | --- | --- | --- | --- |
| Terminal 1 | Type A or B | Type A or B | Type A or B | Type A or B |
| Terminal 2 | Type A | Type B | Type C | Type D |

Thus, Terminal 1 can be one of two types: Type A wherein the PTH 300 is connected to the sides of the core 310, or Type B wherein blind vias 340 are dropped to make contact to the core 310. Terminal 2 can be one of four types: Type A (FIG. 3A) wherein multiple blind vias 340 and PTHs 350 are connected to form the terminal; Type B (FIG. 3B) wherein a rectangular slot 370 is provided in the core 310 for ganging many PTHs together; Type C (FIG. 3C) wherein the rectangular slot forms a single large trench 372/373 filled with a conductor 350A and 300A/340A; and Type D (FIG. 3D) wherein the trench is non-rectangular to allow flexibility in capacitor shape while improving performance (e.g. lowering series inductance).

Figure 6:
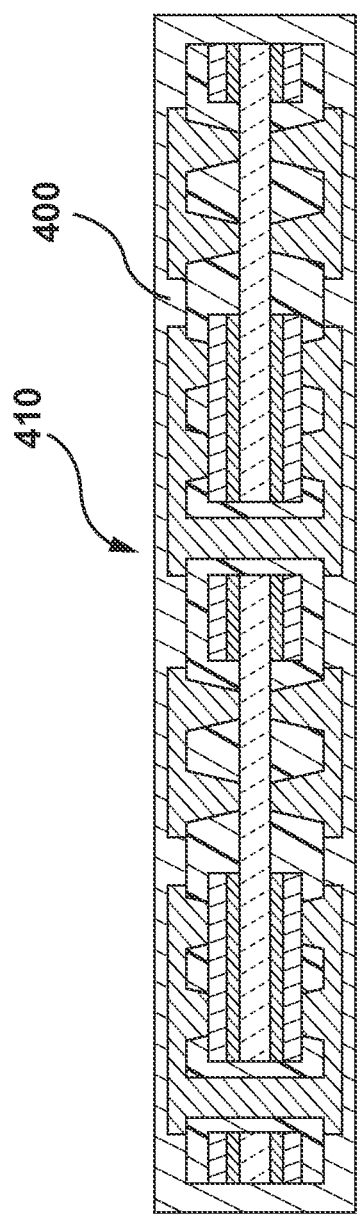
FIG. 6 shows a cross section view of thin-film capacitors that are sealed after singulation and before embedding in a flip chip substrate core, according to aspects of the invention.
Figure 7A:
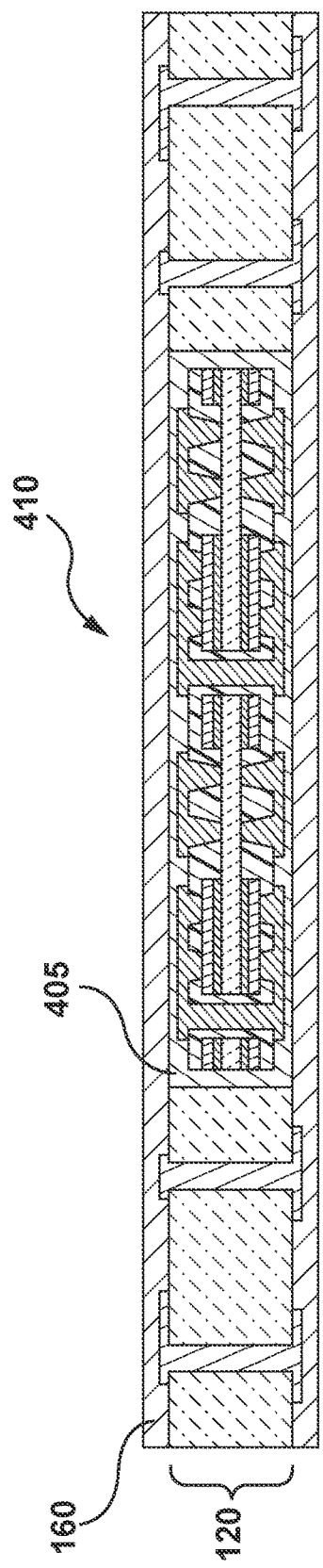
FIG. 7A shows a cross section view of thin-film capacitors that are sealed using gap filling after embedding in a flip chip substrate core, according to aspects of the invention.
Figure 8A:
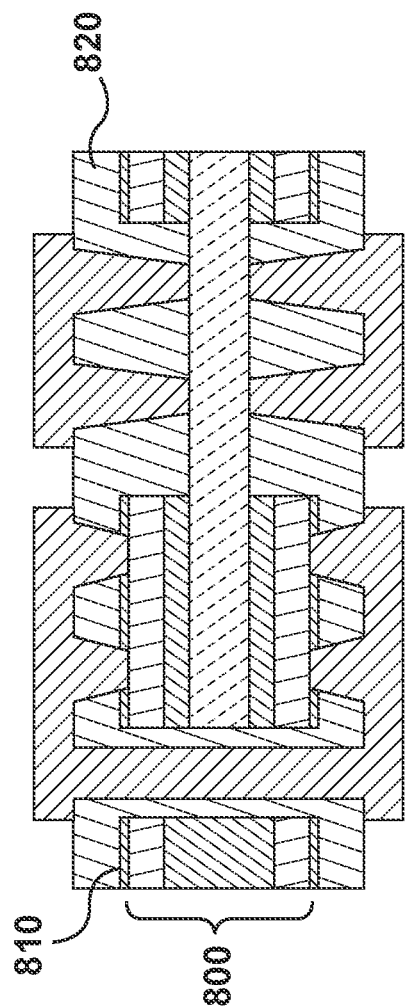
FIG. 8A shows a cross section view of an embodiment of thin-film stacks that are sealed before drilling the vertical connections and metal plating to complete the capacitors, according to aspects of the invention.
Figure 9A:
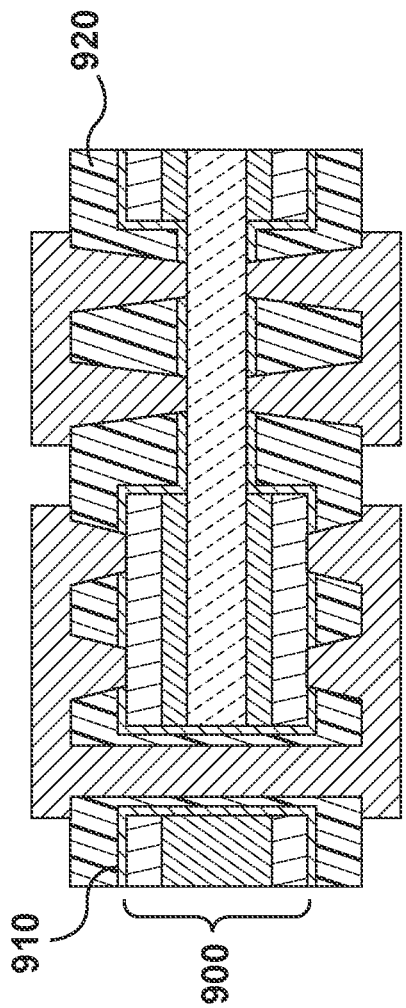
FIG. 9A shows a cross section view of an embodiment of thin-film stacks that are sealed after drilling the vertical connections and before insulator and metal formation, according to aspects of the invention.
Figure 10:
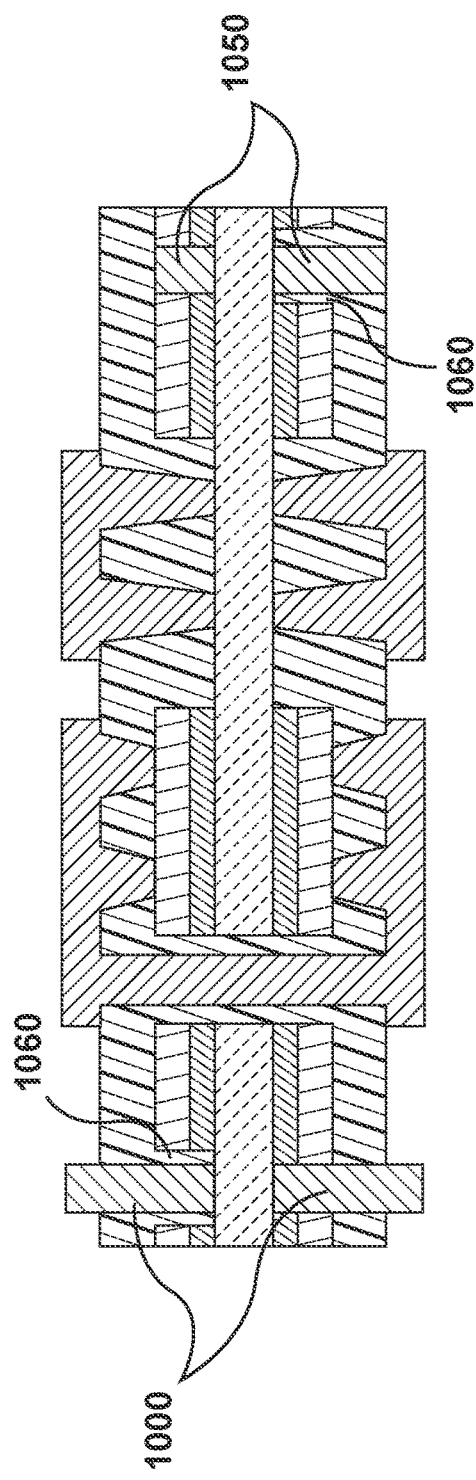
FIG. 10 shows a cross section view of an embodiment of thin-film stacks that are sealed using a seal ring that surrounds the capacitor(s).

With respect to the third general aspect, FIGS. 4A, 5, 6, 7A, 8A, 9A show cross section views of different embodiments of thin-film capacitors that are sealed after drilling the vias/PTH trenches) and terminal metal plating to complete the capacitors, while FIGS. 8A and 9A show cross section views of different embodiments of thin-film stacks that are hermetically sealed before drilling the via/PTH trenches and metal plating to complete the capacitors, and FIG. 10 shows a seal ring around the capacitor(s) according to aspects of the invention. Since the capacitor embodiments set forth in this specification can be sensitive to moisture, the seal functions as a barrier to prevent moisture/gas/chemicals, etc. from penetrating the functional layers of the capacitor(s).

Figure 4A:
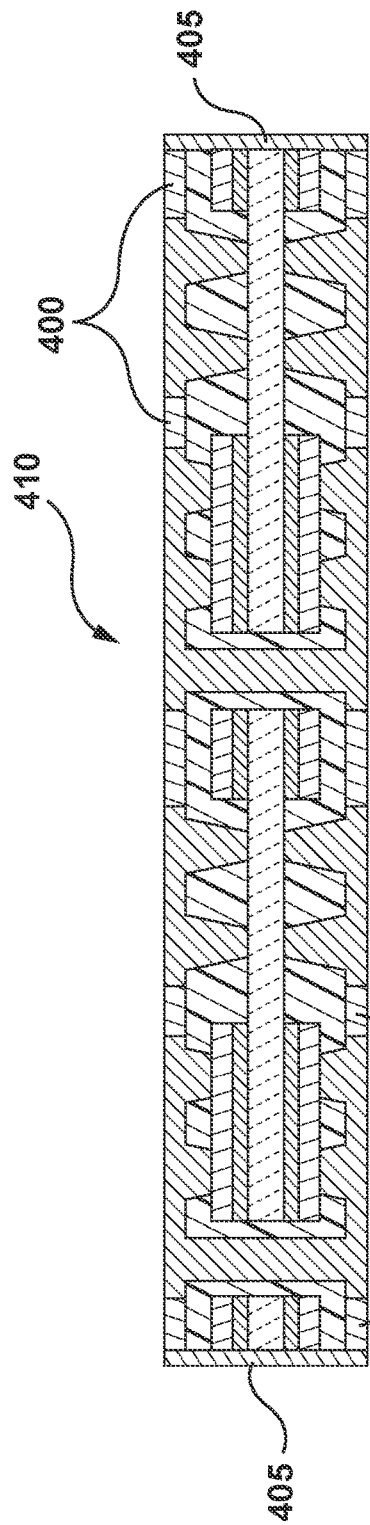
FIG. 4A shows a cross section view of thin-film capacitors that are sealed before singulation and after drilling vertical connections and metal plating to complete the capacitors, according to aspects of the invention.

With reference to FIG. 4A, a thin-film capacitor is shown where a seal 400 is applied before singulation of the thin film sheet 410 into multiple capacitors. After vertical connections (e.g. via holes/PTHs) have been drilled, terminal contacts made etc., the sheet 410 is coated with hermetic or near-hermetic material 400 and then cut (singulated) into sections (e.g. a single capacitor or network/series of capacitors) that can then be embedded into the substrate core of a package. Although the top and bottom surfaces are sealed, the side walls are exposed, which requires adding an additional seal 405 during or after embedding the capacitor(s) in the substrate core, as discussed below with reference to FIG. 5.

Figure 4B:
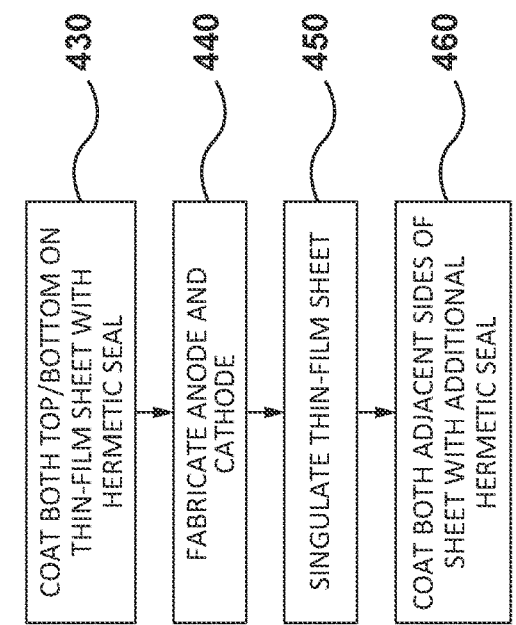
FIG. 4B is a flowchart of a method of fabricating a plurality of sealed thin-film capacitors of FIG. 4A.

With reference to FIG. 4B, steps of a method 420 of fabricating a plurality of hermetically sealed thin-film capacitors are shown. At 430, both sides (i.e. the planar top and bottom surfaces) of the thin film sheet 410 are coated with a hermetic seal, wherein the thin film sheet includes the structures shown in FIGS. 3, 3A, 3B, 3C and 3D, namely an insulator 305, a conductive core 310 within the insulator, and a current collector 320 separated from the conductive core by a dielectric 330. The top and bottom surfaces can be coated using any of a number of known techniques, such as dipping, spinning, etc. At step 440, at least one first terminal is fabricated forming one of either a cathode or anode connected to the conductive core 310 through the insulator 305, and at least one second terminal forming the other of either the cathode or anode connected to the current collector 320. In some embodiments, the anode and cathode terminals can be fabricated by sputtering metal through a mask on top of the hermetic seal 400. At 450, the thin film sheet 410 is singulated into a plurality of individual thin-film capacitors that are hermetically sealed on the both planar sides (i.e. top and bottom) while unsealed on adjacent sides (i.e. exposed left and right sides where singulation occurs). Then, at 460, the unsealed adjacent sides are coated with an additional hermetic seal 405.

Figure 5:
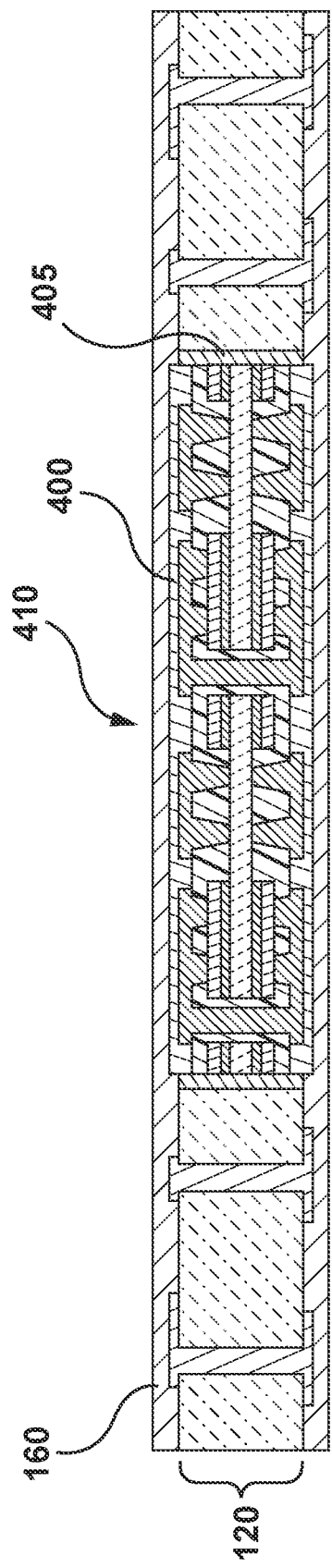
FIG. 5 shows a cross section view of thin-film capacitors that are sealed while embedding in a flip chip substrate core, according to aspects of the invention.

In the embodiment of FIG. 5, the additional hermetic seal 405 is applied during embedding of the capacitors in the substrate core 120, for example by gap-filling the sides of the thin-film sheet, and thereafter singulating the sheet.

Alternatively, as shown in the embodiment of FIG. 6 the thin film sheet 410 can be singulated, sealed on all sides with hermetic seal 400 and the individual sealed capacitors (or network of capacitors) thereafter be embedded in the substrate core.

Figure 7B:
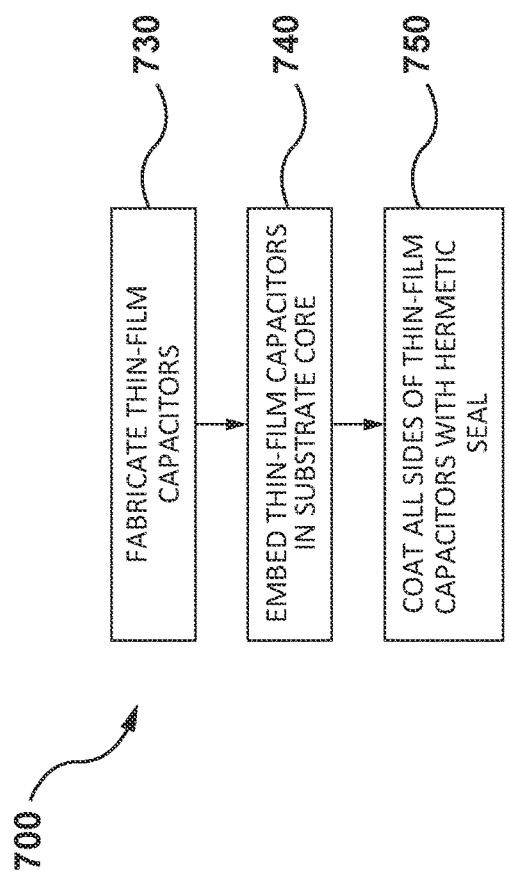
FIG. 7B is a flowchart of a method of fabricating a plurality of sealed thin-film capacitors of FIG. 7A.

In the embodiment of FIG. 7A, the singulated and sealed thin film sheet of FIG. 6 is gap sealed after embedding using, for example, the method 700 of FIG. 7B, where at step 730 at least one thin-film capacitor is fabricated, having an insulator 305, a conductive core 310 within the insulator, and a current collector 320 separated from the conductive core by a dielectric 330, as well as vias/PTHs and anode/cathode terminal contacts. At 740, the at least one thin-film capacitor is embedded in the substrate core 120. Then, at 750, all sides of the embedded thin-film capacitor are coated using gap-filling with a hermetic seal 405.

Figure 8B:
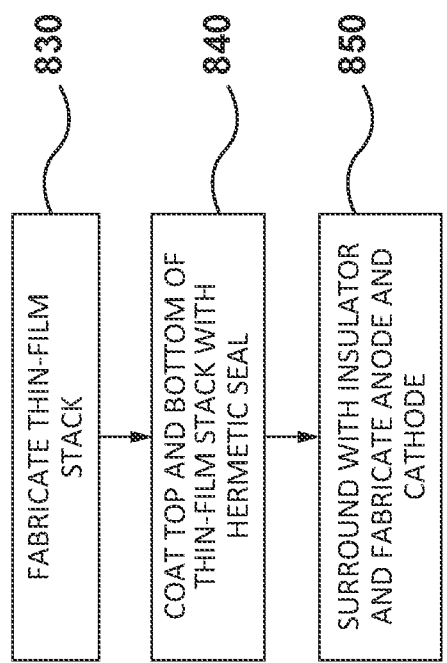
FIG. 8B is a flowchart of a method of fabricating a plurality of sealed thin-film capacitors of FIG. 8A.

Turning to FIG. 8A, embodiments are shown where the thin-film stack 800 comprising conductive core, current collector and dielectric are coated with a hermetic seal 810 before encapsulating in insulator 820 and drilling for trenching/Via/PTH to fabricate terminals and DC passthrough, where most of the capacitor area is sealed although not the sides of the thin-film stack 800. FIG. 8B shows steps for fabricating the structures of FIG. 8A. At step 830, the thin-film stack 800 is fabricated, including the insulator, conductive core within the insulator, and a current collector separated from the conductive core by the dielectric. At 840, top and bottom surfaces of the thin-film stack are coated with a hermetic seal. Then, at 850; a first terminal is fabricated (for example using via/PTH drilling followed by metallization) forming one of either the cathode or anode connected to the conductive core through the hermetic seal and insulator, and a second terminal is fabricated forming the other of either the cathode or anode connected to the current collector through the insulator and hermetic seal.

Figure 9B:
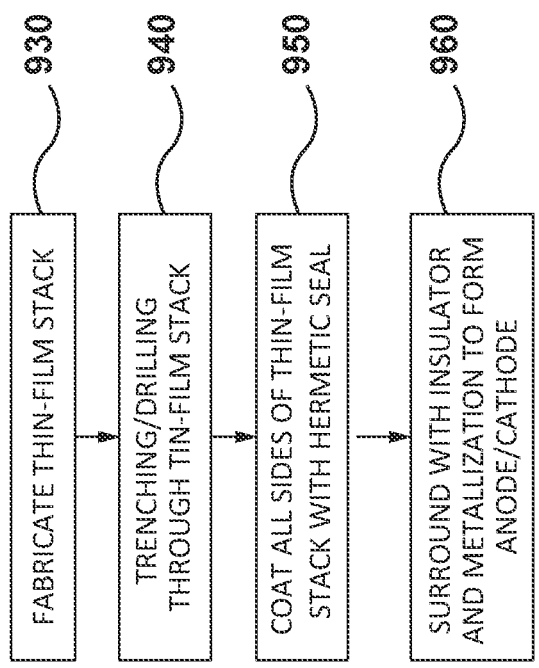
FIG. 9B is a flowchart of a method of fabricating a plurality of sealed thin-film capacitors of FIG. 9A.

As an alternative to the embodiments of FIG. 8A, the hermetic seal can be applied after trenching and drilling but before embedding the thin film stack in the insulator and metalizing to form anode and cathode terminals, resulting in the structure of FIG. 9A, where all sides of the thin film stack 900 are covered with sealant. FIG. 9B shows steps for fabricating the structures of FIG. 9A. At step 930, the thin-film stack 900 is fabricated, including the insulator, conductive core within the insulator, and a current collector separated from the conductive core by the dielectric. At 940, drilling/and trenching of vias/PTHs is performed. At step 950, all sides of the thin-film stack are coated with a hermetic seal. Then, at 960; the thin-film stack is surrounded with insulator and anode/cathode contact terminals and DC pass through are fabricated through the vias/PTH holes drilled at step 940.

As a further alternative to the embodiments of FIGS. 8A and 9A, a seal ring 1000/1050 can surround the capacitor(s) that acts as a barrier to moisture, gas, chemicals, etc. entering the dielectric and current collector, as shown in FIG. 10, where the height of the barrier can extend to the top and bottom /terminal metal as shown at 1000, or be the same as the functional layer thickness of the thin-film stack, as shown at 1050. Also, as shown at 1060, a recess may be provided around the seal ring 1000/1050.

Figure 11:
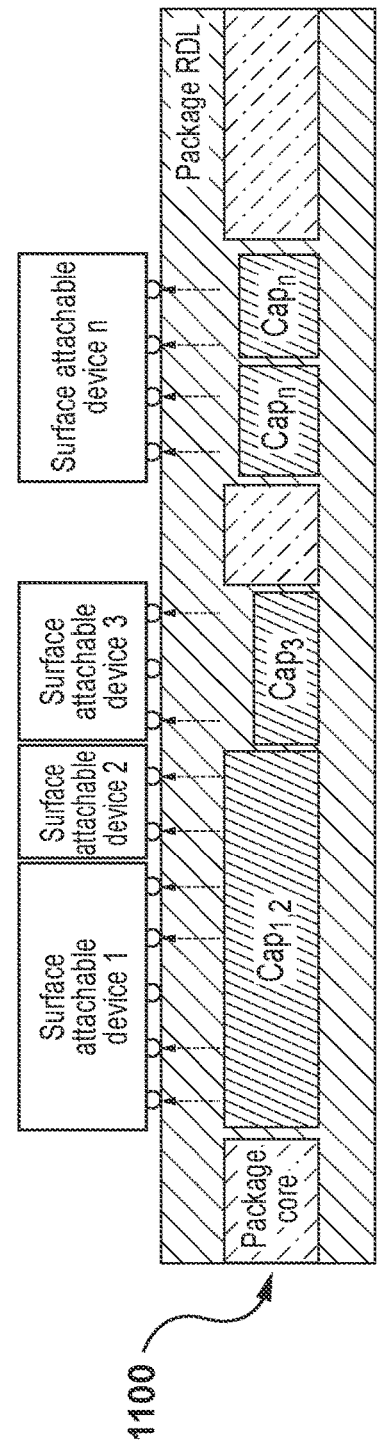
FIG. 11 shows a cross section view of an embodiment of semiconductor package with a single or combination of capacitors underneath a single or combination of surface attachable devices' shadow.

FIG. 11 shows a cross section view of an embodiment of semiconductor package 1100 with area dependent cathode and anode for better ESR/ESL and current carrying capability. In FIG. 11, capacitors $Cap_{1,2}$, $Cap_3$ and $Cap_n$ are drawn fully custom within the package core in order to meet individual capacitance and current handling capabilities. Furthermore, the surface attachable device outline of each device (e.g. surface attachable device 3) or a combination of adjacent devices (e.g. surface attachable devices 1 and 2, and surface attachable devices n) represents a "shadow" within which the underlying capacitor(s) is/are fabricated. Thus, in FIG. 11, $Cap_{1,2}$ is located in the shadow of surface attachable devices 1 and 2, $Cap_3$ is located in the shadow of surface attachable device 3 and two $Cap_n$ capacitors are located in the shadow of surface attachable device n. Connections between the capacitors and surface attachable devices is through the package RDL, as discussed above. Also, the capacitors may be of different sizes and-thicknesses. As can be seen, a single capacitor can thereby service a single surface attachable device under its shadow, or multiple surface attachable devices under their combined shadow, and multiple capacitors can service a single surface attachable devices under its shadow. In summary, each capacitor can follow the physical layout or profile of each domain/functional block of a single surface attachable device.

The present invention has been described with respect to various alternatives and embodiments.

The many features and advantages of the invention are apparent from the detailed specification and, thus, it is intended by the appended claims to cover all such features and advantages of the invention that fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of comprising the steps of:
    Step 1: fabricating a thin film sheet comprising a plurality of thin film capacitors, each capacitor comprising:
        an insulator:
        a conductive core within the insulator; and
        a current collector separated from the conductive core by a dielectric;
        wherein the insulator, conductive core and current collector are selectively configured to form:
            a top surface;
            a bottom surface; and
            a plurality of adjacent side surfaces;
    Step 2: coating both the top surface and the bottom surface of each of the capacitors with a seal to prevent moisture/gas/chemicals from penetrating the capacitors;
    Step 3: fabricating at least one first terminal forming one of either a cathode or anode connected to the conductive core through the insulator, and at least one second terminal forming the other of either the cathode or anode connected to the current collector;
    Step 4: singulating the thin film sheet into a plurality of individual thin-film capacitors sealed on said both top and bottom surfaces while unsealed on adjacent sides; and
    Step 5: coating the unsealed adjacent sides with an additional seal.

2. The method of claim 1, further comprising, after Step 3, the steps of

Step 6: fabricating a package substrate core;
Step 7: embedding the thin film sheet in the package substrate core;
Step 8: coating the unsealed adjacent side surfaces with said additional seal; and
Step 9: singulating the thin film sheet and substrate core.

3. The method of claim 1, further comprising, after Step 5, the steps of:
Step 10: fabricating a package substrate core;
Step 11: embedding the plurality of individual thin film capacitors in the package substrate core; and
Step 12: coating the unsealed adjacent side surfaces with said additional seal.

4. A method of fabricating a package having at least one semiconductor die, a substrate core to which the semiconductor die is mounted on one side via first level interconnects, and second level interconnects on an opposite side of the substrate core for connection to external circuitry, the method comprising:
fabricating a thin-film capacitor having an insulator, a conductive core within the insulator, at least one first terminal forming one of either a cathode or anode connected to the conductive core through the insulator, a current collector separated from the conductive core by a dielectric, and at least one second terminal forming the other of either the cathode or anode connected to the current collector;
singulating the thin film sheet into a plurality of individual thin-film capacitors;
coating all sides of the singulated thin-film capacitor with a seal; and
embedding the thin-film capacitor in the substrate core.

5. A method of fabricating a package having at least one semiconductor die, a substrate core to which the semiconductor die is mounted on one side via first level interconnects, and second level interconnects on an opposite side of the substrate core for connection to external circuitry, the method comprising:
fabricating a thin-film stack comprising a conductive core and a current collector separated from the conductive core by a dielectric;
coating top and bottom of the thin-film stack with a seal;
fabricating an insulator around the thin-film stack; and
drilling one or more vertical connections in the thin-film stack including at least two vertical connections for fabricating at least one first terminal forming one of either a cathode or anode connected to the conductive core through the insulator, and at least one second terminal forming the other of either the cathode or anode connected to the current collector through the insulator.

6. A method of fabricating a package having at least one semiconductor die, a substrate core to which the semiconductor die is mounted on one side via first level interconnects, and second level interconnects on an opposite side of the substrate core for connection to external circuitry, the method comprising:
fabricating a thin-film stack comprising a conductive core and a current collector separated from the conductive core by a dielectric;
drilling one or more vertical connections though the thin film stack;
coating all sides of the thin-film stack with a seal;
surrounding the sealed thin-film stack with an insulator; and
fabricating at least one first terminal forming one of either a cathode or anode connected using one of said vertical connections to the conductive core through the insulator and seal and fabricating at least one second terminal forming the other of either the cathode or anode connected using a further one of said vertical connections to the current collector through the insulator and seal.

7. A method of fabricating a package having at least one semiconductor die, a substrate core to which the semiconductor die is mounted on one side via first level interconnects, and second level interconnects on an opposite side of the substrate core for connection to external circuitry, the method comprising:
fabricating a thin-film stack comprising an insulator, a conductive core within the insulator and a current collector separated from the conductive core by a dielectric;
drilling one or more vertical connections though the thin-film stack;
fabricating at least one first terminal forming one of either a cathode or anode connected using one of said vertical connections to the conductive core through the insulator and seal, and fabricating at least one second terminal forming the other of either the cathode or anode connected using a further one of said vertical connections to the current collector through the insulator and seal; and
fabricating a seal ring surrounding the thin-film stack as a barrier to one or more of moisture, gas and chemicals entering the dielectric and current collector.

8. The method of claim 7, wherein the height of the barrier extends to the first and second terminals.

9. The method of claim 7, wherein the height of the barrier is the same as the thickness of the thin-film stack.

10. A method comprising the steps of:
Step 1: fabricating a thin film sheet capacitor comprising:
an insulator;
a conductive core embedded within the insulator; and
a current collector separated from the conductive core by a dielectric;
wherein the insulator, conductive core and current collector are selectively configured to form:
a top surface;
a bottom surface; and
a plurality of adjacent side surfaces;
Step 2: coating both the top surface and the bottom surface of the capacitor with a seal; and
Step 3: fabricating:
a first terminal, selected from a cathode and an anode, connected to the conductive core through the insulator; and
a second terminal, selected from the other of the cathode and anode, connected to the current collector through the insulator.

* * * * *